United States Patent
Wong et al.

(10) Patent No.: US 10,897,266 B2
(45) Date of Patent: Jan. 19, 2021

(54) RF QUADRATURE MIXING DIGITAL-TO-ANALOG CONVERSION

(71) Applicant: JARIET TECHNOLOGIES, INC., Redondo Beach, CA (US)

(72) Inventors: Ark-Chew Wong, Irvine, CA (US); Craig A. Hornbuckle, Rolling Hills Estates, CA (US); Richard Dennis Alexander, Lake Forest, CA (US)

(73) Assignee: Jariet Technologies, Inc., Redondo Beach, CA (US)

( * ) Notice: Subject to any disclaimer, the term of this patent is extended or adjusted under 35 U.S.C. 154(b) by 0 days.

(21) Appl. No.: 16/609,630

(22) PCT Filed: May 1, 2018

(86) PCT No.: PCT/US2018/030532
§ 371 (c)(1),
(2) Date: Oct. 30, 2019

(87) PCT Pub. No.: WO2018/204417
PCT Pub. Date: Nov. 8, 2018

(65) Prior Publication Data
US 2020/0119746 A1    Apr. 16, 2020

Related U.S. Application Data

(60) Provisional application No. 62/500,413, filed on May 2, 2017.

(51) Int. Cl.
*H03M 1/66* (2006.01)
*H03D 7/14* (2006.01)
(Continued)

(52) U.S. Cl.
CPC ............... *H03M 1/66* (2013.01); *H03D 7/14* (2013.01); *H03H 11/04* (2013.01); *H03M 1/06* (2013.01);
(Continued)

(58) Field of Classification Search
CPC ........... H03M 1/66; H03D 7/14; H03D 7/161; H04B 1/18; H04B 1/10
(Continued)

(56) References Cited

U.S. PATENT DOCUMENTS 7,027,702 B2    4/2006  Luff
7,027,792 B1 *  4/2006  Luff .................... H03D 7/1425
                                                      327/113
(Continued)

FOREIGN PATENT DOCUMENTS

EP          2592755        5/2013

OTHER PUBLICATIONS

International Search Report for International Patent Application No. PCT/US2018/030532 dated Sep. 4, 2018.
(Continued)

*Primary Examiner* — Joseph J Lauture
(74) *Attorney, Agent, or Firm* — Morgan, Lewis & Bockius LLP

(57) ABSTRACT

A double-balanced radio-frequency (RF) mixing digital-to-analog converter (DAC) apparatus includes a load network, a first set of resistive DAC driver circuits and a first mixing core. The first mixing core can receive first RF input signals from the first set of resistive DAC driver circuits and can provide a first mixed signal to the load network. The first mixing core includes a first input differential pair coupled to two first cross-coupled differential pairs. The first input differential pair can receive first RF input signals at respective first input nodes. Each of the two first cross-coupled
(Continued)

differential pairs can receive first positive and negative local oscillator (LO) signals at corresponding first input nodes. The first mixing core can mix the first RF input signals with the first positive and negative LO signals.

19 Claims, 17 Drawing Sheets

(51) Int. Cl.
    *H03H 11/04*    (2006.01)
    *H03M 1/06*     (2006.01)
    *H04B 1/18*     (2006.01)
    *H04B 1/10*     (2006.01)
    *H03D 7/16*     (2006.01)

(52) U.S. Cl.
    CPC ............... *H03D 7/161* (2013.01); *H04B 1/10* (2013.01); *H04B 1/18* (2013.01)

(58) Field of Classification Search
    USPC ......... 341/144; 455/326, 334, 280, 314, 296
    See application file for complete search history.

(56) References Cited

U.S. PATENT DOCUMENTS

| | | |
|---|---|---|
| 2002/0153954 A1 | 10/2002 | Hochschild |
| 2005/0159130 A1 | 7/2005 | Yang |
| 2005/0213672 A1 | 9/2005 | Lin et al. |
| 2006/0279444 A1 | 12/2006 | Eo |
| 2008/0132189 A1* | 6/2008 | Maxim ............... H04B 1/28 455/280 |
| 2008/0132195 A1 | 6/2008 | Maxim et al. |
| 2008/0248775 A1 | 10/2008 | Tsai |
| 2009/0231053 A1 | 9/2009 | Schwoerer |
| 2011/0059709 A1 | 3/2011 | Collins, III |
| 2013/0162363 A1 | 6/2013 | Han |

OTHER PUBLICATIONS

Extended European Search Report from 18795038.1, dated Nov. 9, 2020, 8 pages.

* cited by examiner

… (1)

RF QUADRATURE MIXING DIGITAL-TO-ANALOG CONVERSION

CROSS-REFERENCE TO RELATED APPLICATIONS

This application claims the benefit of priority under 35 U.S.C. § 119 from U.S. Provisional Patent Application 62/500,413 filed May 2, 2017, which is incorporated herein by reference in its entirety.

TECHNICAL FIELD

The present description relates in general to radio frequency (RF) systems, and more particularly to, for example, without limitation, RF quadrature mixing digital-to-analog conversion.

BACKGROUND

Digital-to-analog converter (DAC) circuits are commonly used to convert digital signals to analog signals. Example applications of DAC circuits are in communication devices and systems. For instance, almost all communication devices such as hand-held communication devices including smart phones, tablets, phablets, and other communication devices employ one or more DAC circuits. DAC circuits are characterized by properties such as resolution, accuracy, and maximum sampling frequency, and can be implemented in integrated circuits based on a number of different architectures.

The description provided in the background section should not be assumed to be prior art merely because it is mentioned in or associated with the background section. The background section may include information that describes one or more aspects of the subject technology.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various ways, all without departing from the scope of the present disclosure. Accordingly, the drawings and description are to be regarded as illustrative in nature and not restrictive.

In one or more aspects, an RF mixing DAC is provided. The RF mixing DAC of the subject technology integrates the function of the mixer and the DAC into a single circuit. The DAC can be a resistive DAC or a current-steering DAC, and the mixer can be a single-balanced or a double-balanced RF mixer. The subject disclosure introduces a new architecture for integrating the functions of a mixer and a digital-to-analog converter together to form an up-conversion transmitting device for an RF system. In the disclosed architecture, a quadrature mixing approach is used for image rejection and LO cancellation. The quadrature approach can also be adapted for a current steering architecture and an interleaved architecture. The existing approaches do not incorporate any quadrature (i.e. I-Q phases) or interleaved architecture. In addition, the exiting designs typically use a current steering DAC approach and do not utilize the resistive DAC approach of the subject technology.

The subject technology further allows adapting quadrature RF mixing DAC using a current-steering approach in a DAC architecture that can include a common-mode logic-based (CML-based) or folded architecture. In some aspects, a hybrid DAC, combining both a current steering and a series self-terminated (SST) approach can be used.

Figure 1:
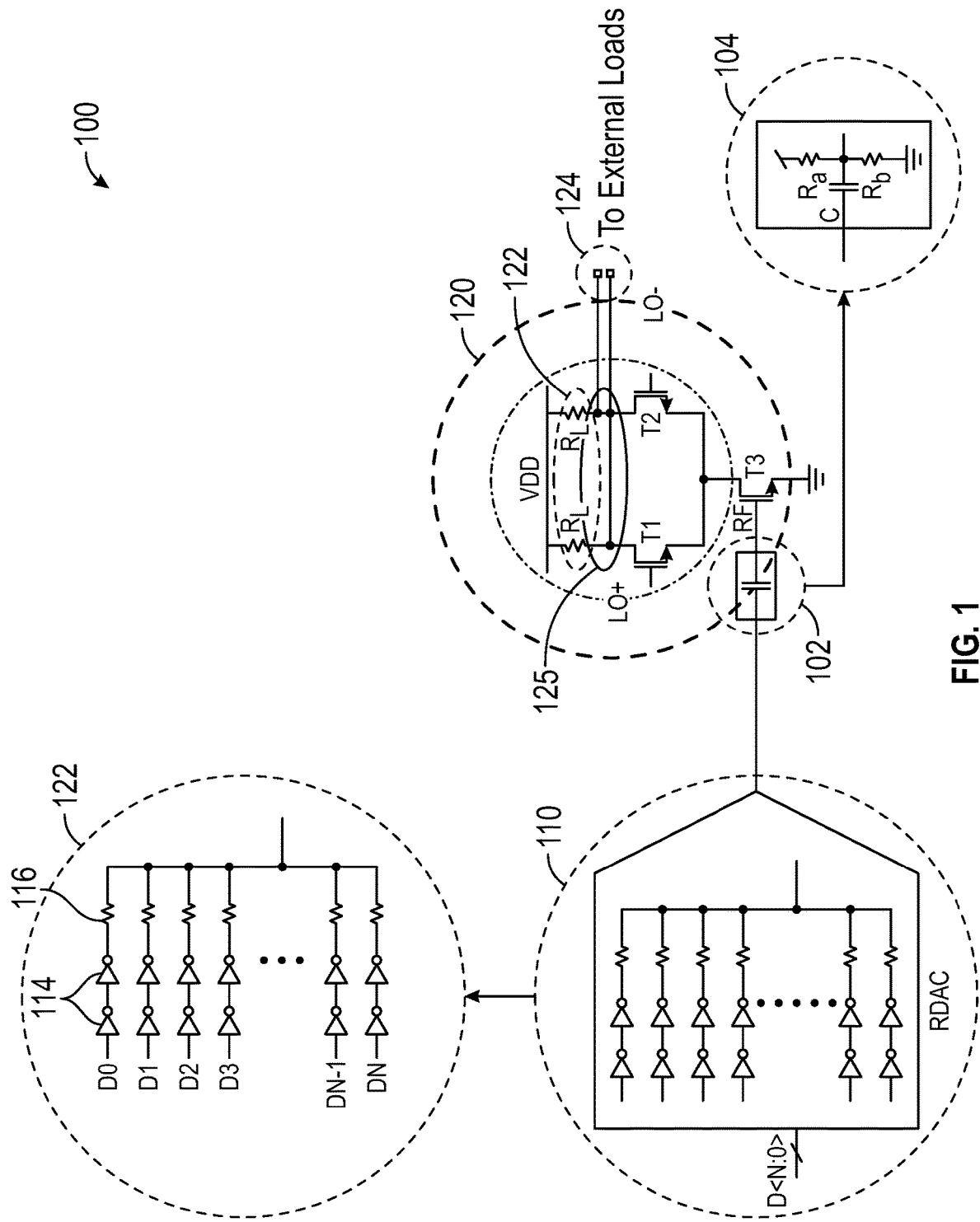
FIG. 1 is a schematic diagram illustrating an example of a single-balanced RF mixing digital-to-analog converter (DAC) configuration.

FIG. 1 is a schematic diagram illustrating an example of a single-balanced RF mixing digital-to-analog converter (DAC) configuration. The single-balanced RF mixing DAC circuit 100 shown in FIG. 1 includes a series self-terminated (SST) driver resistive DAC (RDAC) circuit 110 and a single-balanced RF mixer 120 (hereinafter "mixer 120"). An exploded view 112 shows an example implementation of the resistive DAC circuit 110. The resistive DAC circuit 110, as shown in the exploded view 112 is a voltage mode DAC driver realized using resistors and inverters. Each input branch of the resistive DAC can include two inverters 114 and a resistor 116 and receives a respective digital signal (e.g., D1, D2 ... DN) that is based on a bit of the digital input signal. In an aspect, the resistive DAC circuit 110 may be associated with 4 bits, 16 bits, or other number of bits depending on the application. The analog output signal of the resistive DAC circuit 110 is provided to the mixer 120 coupled to the output node of the resistive DAC circuit 110.

The analog output of the resistive DAC circuit 110 is coupled via a filter 102 to an RF input of the mixer 120.

The filter 102, as shown in the exploded view 104 can be a coupling capacitor C, and in some implementations, may include bias resistors Ra and Rb. The coupling capacitor C is open circuit for DC current and can block DC currents. The bias resistors Ra and Rb couple an input node of the mixer 120 to the supply voltage (e.g., VDD) and the ground potential. In the absence of the bias resistors Ra and Rb, the input node of the mixer 120 floats and has no fixed bias voltage. The bias resistors Ra and Rb can function as a voltage divider and provide a fixed portion of the supply voltage to the input node of the mixer 120, which is isolated from any DC current flowing from the resistive DAC circuit 110 due to the DC blocking capacitor C. The bias resistors Ra and Rb may also work as the termination resistors for the resistive DAC circuit 110.

The mixer 120 receives an RF signal generated (by conversion of the digital signal) by the resistive DAC circuit 110 and mixes the RF signal with a local oscillator (LO) applied to the mixer circuit as differential LO+ and LO− signals. The mixer 120 includes a switching differential pair of transistors T1 and T2 (e.g., MOS such as NMOS transistors) and has a third transistor T3 coupled between common source of the transistor T1 and T2 and the ground potential. The RF signal is applied to the gate of the third transistor T3 and generates a corresponding drain current that is modulated by the LO signals applied to the gate nodes of the transistors T1 and T2 of the switching differential pair. The transistors T1 and T2 of the switching differential pair are coupled to a supply voltage VDD through a load network 122 formed of load resistors RL, and the intermediate frequency (IF) output is drawn from the drain nodes of the transistors T1 and T2 of the switching differential pair at output nodes 124.

In one or more embodiments, a cascode circuit 125 (not shown for simplicity) can be added between the load resistors RL and the switching differential pair to provide further isolation of the output from the LO signals. This cascode circuit 125 can prevent LO leakage to the output nodes 124, which is ideally supposed to provide a pure IF signal. In some implementations, a current-steering DAC can replace the resistive DAC circuit 110. The use of the resistive DAC circuit 110, however, is more advantageous, for ease of implementation and higher bandwidth and linearity performance.

Figure 2A:
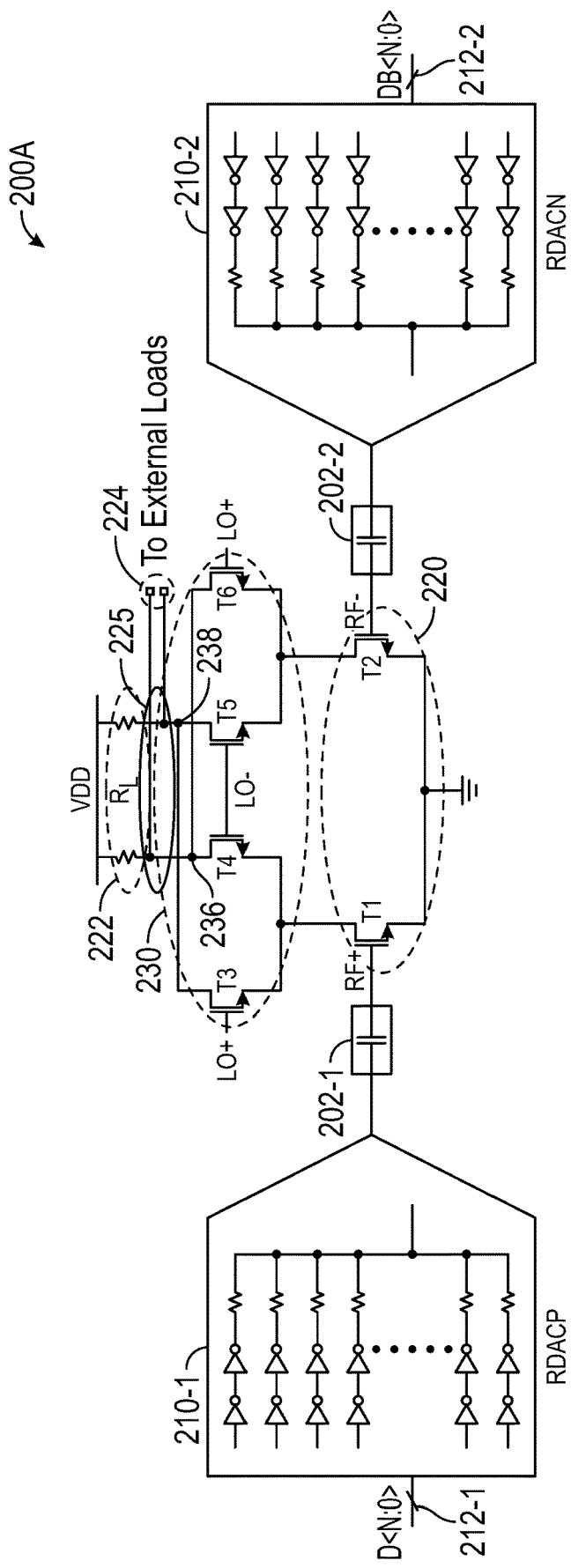
FIGS. 2A-2B are schematic diagrams illustrating examples of a double-balanced RF mixing DAC configuration.
Figure 2B:
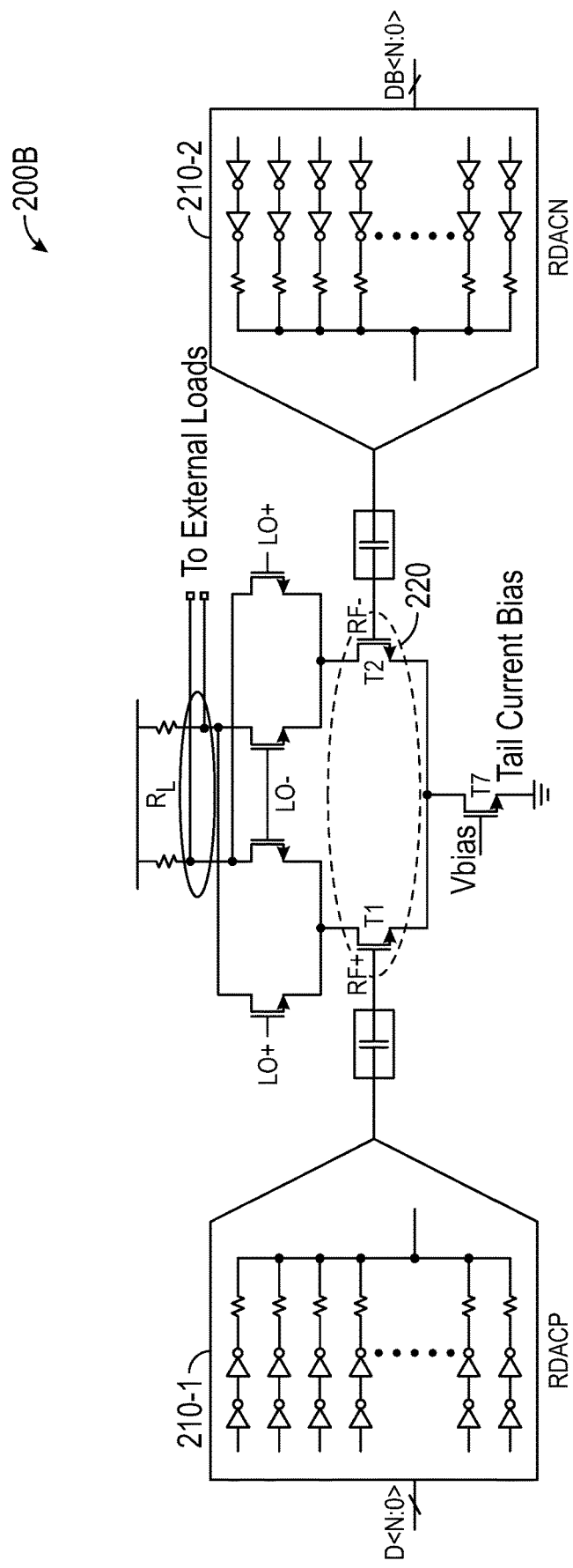

FIGS. 2A-2B are schematic diagrams illustrating examples of a double-balanced RF mixing DAC configuration. The double-balanced RF mixing DAC circuit 200A (hereinafter "mixing DAC circuit 200A") of FIG. 2A is a differential configuration based on the single-balanced RF mixing DAC circuit 100 of FIG. 1. The mixing DAC circuit 200A can be thought of as a parallel combination of two single-balanced RF mixing DAC (e.g., 100 of FIG. 1) where LO− nodes of the two switching differential pairs (e.g., transistor pairs T3-T4 and T5-T6) are coupled together, and the source nodes of the third transistors (e.g., transistor T1 and T2) are jointly coupled to the ground potential. The differential pairs T3-T4 and T5-T6 are coupled as a cross-coupled differential pairs 230. In the cross-coupled differential pairs 230, drain nodes of transistor T4 and T6 are coupled to a node 236 and drain nods of transistor T3 and T5 are coupled to a node 238. The node 236 and 238 are connected to output nodes 224 of the mixing DAC circuit 200A. The common source nodes 232 and 234 of the cross-coupled differential pairs 230 are connected to drain nodes of transistors T1 and T2 of an input differential pair 220.

In one or more embodiments, a cascode circuit 225 (not shown for simplicity) can be added between the load resistors RL and the cross-coupled differential pairs 230 to provide further isolation of the output from the LO signal to prevent LO leakage to the output nodes 224, which is ideally supposed to provide a pure IF signal.

The resistive load 222 is similar to the resistive load 122 of FIG. 1. A cascode circuit 225 (not shown for simplicity) can be coupled to isolate the output nodes 224 from the LO signals (e.g., LO+ and LO−). The two resistive DACs (RDACs) 210-1 and 210-2 are coupled to input nodes (RF nodes) of the third transistors T1 and T2 of the input differential pair 220 via respective DC blocking networks 202-1 and 202-2. In some implementations, a current-steering DAC can replace the RDACs. The use of the RDACs, however, is more advantageous, for ease of implementation, higher bandwidth, and linearity performance.

The double-balanced RF mixing DAC circuit 220B shown in FIG. 2B is similar to the mixing DAC circuit 220A of FIG. 2A, except for the addition of a tail current bias transistor T7. The tail current bias transistor T7 is coupled between the joint source node of the third transistors T1 and T2 and the ground potential. It is understood that the addition of the tail current bias transistor T7 is only possible if sufficient headroom is provided by the DC supply voltage VDD. In some implementations, a current-steering DAC can replace the resistive DACs 210-1 and 210-2. The use of the resistive DACs 210-1 and 210-2, however, is more advantageous, for ease of implementation, higher bandwidth, and linearity performance.

Figure 3:
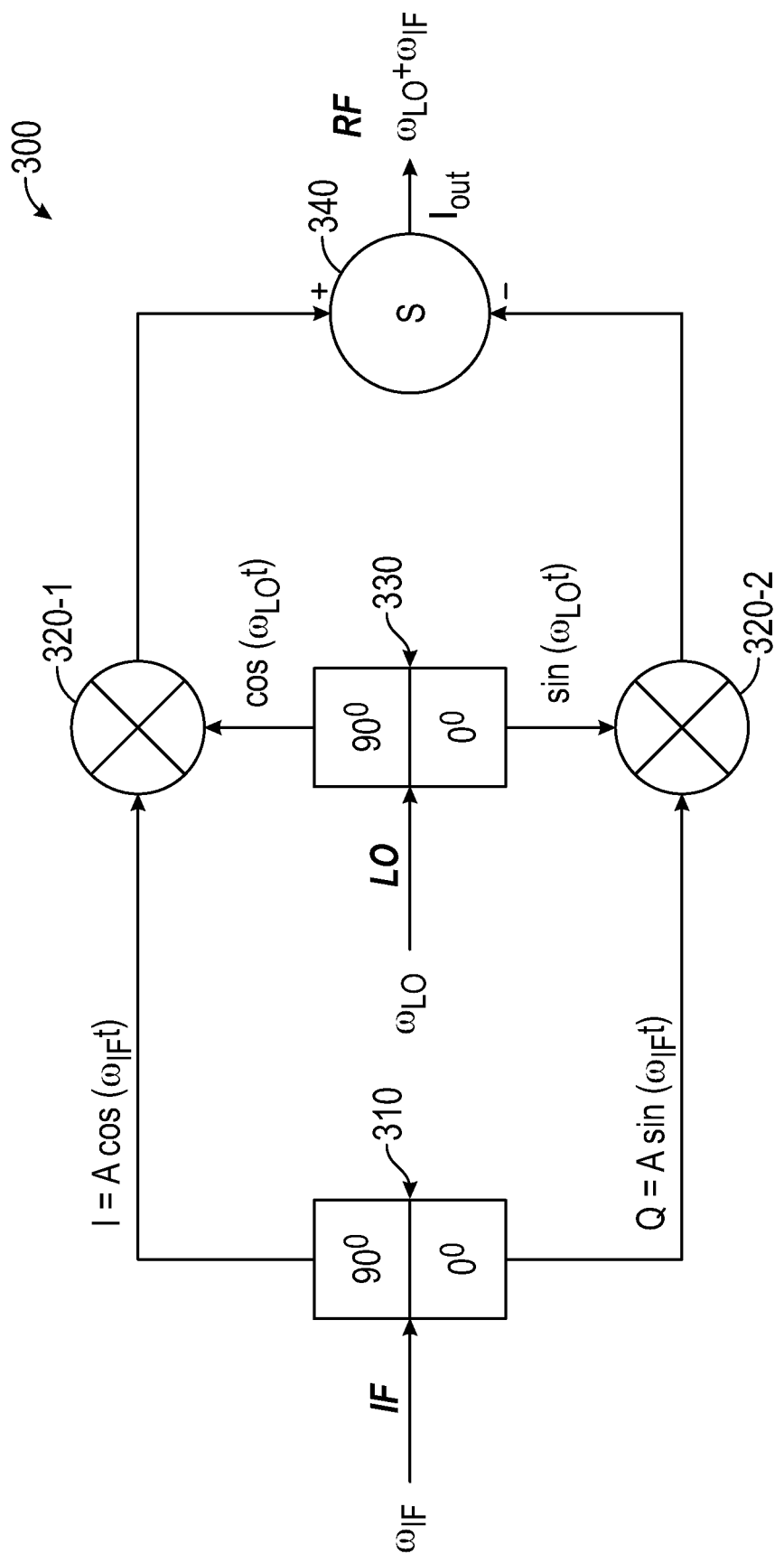
FIG. 3 illustrates an example of a quadrature mixer.

FIG. 3 illustrates an example of a quadrature mixer 300. The quadrature mixer 300 of FIG. 3 includes two mixers 320-1 and 320-2 that can respectively mix quadrature input signals, for example, an in-phase (I) signal (I=A cos ($\omega_{IF}t$)) and a quadrature (Q) signal (Q=A sin ($\omega_{IF}t$)) with quadrature LO signals (e.g., cos ($\omega_{LO}t$) and sin ($\omega_{LO}t$)) generated by the LO generator 330 to create lower band and higher band mixing products. It is understood that the quadrature signals have 90° phase difference that are created by a phase shift circuit 310. Note that the lower-band mixing product, $\omega_{LO}-\omega_{IF}$, is cancelled out through appropriate phase manipulation and addition at the summer output 340. At the end, only the higher-band mixing product, $\omega_{LO}+\omega_{IF}$, remains at the output. One advantage of the quadrature mixer 300 is that the automatic cancellation of the lower side-band mixing product negates the need for any bandpass filtering at the output. The subject disclosure replaces the two mixers 320-1 and 320-2 of the quadrature mixer 300 with quadrature RF mixing DACs of FIG. 2A or 2B.

Figures 4A, 4B, 4C:
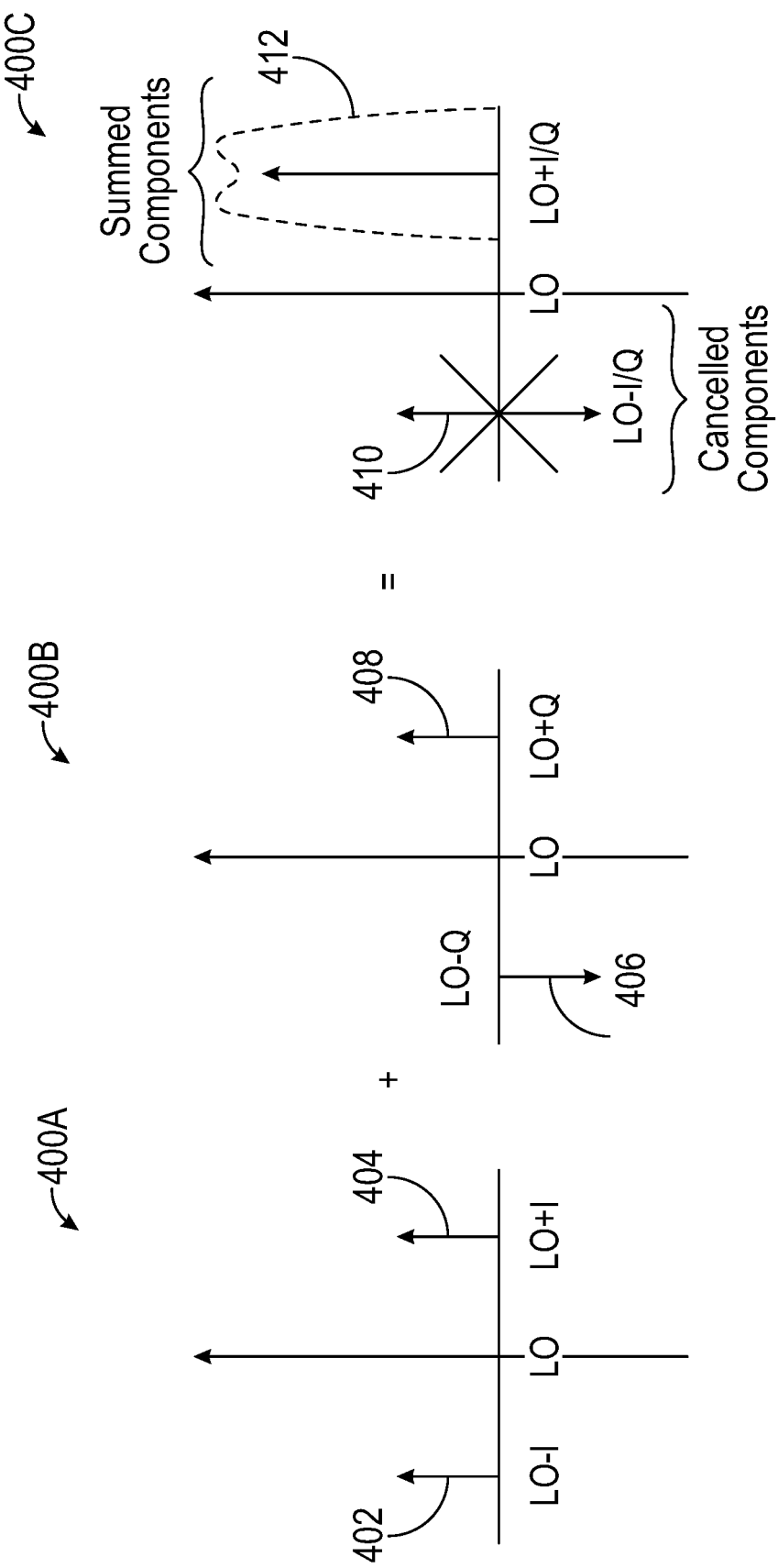
FIGS. 4A through 4C illustrate an example of a local oscillator (LO)-tone signal cancellation scheme.

FIGS. 4A through 4C illustrate an example of a local oscillator (LO)-tone signal cancellation scheme. In FIGS. 4A through 4C, the X-axis denotes frequency and LO is the LO frequency. I and Q are I-phase and Q-phase of the IF frequency, respectively. The signal components 402 and 404 shown in FIG. 4A are translated/mixed-up in-phase signals. The tone signals shown 406 and 408 in FIG. 4B are translated/mixed-up quadrature signals. The tone signals 410 and 412 shown in FIG. 4C are translated/mixed-up RF signals that are produced by summing the tone signals in FIGS. 4A and 4B. In the summation, the image components represented by LO-I (e.g., 402) and LO-Q (e.g., 404) cancel out (image rejection), whereas the signal components 404 and 408 add up to form the summed signal 412.

Figure 5:
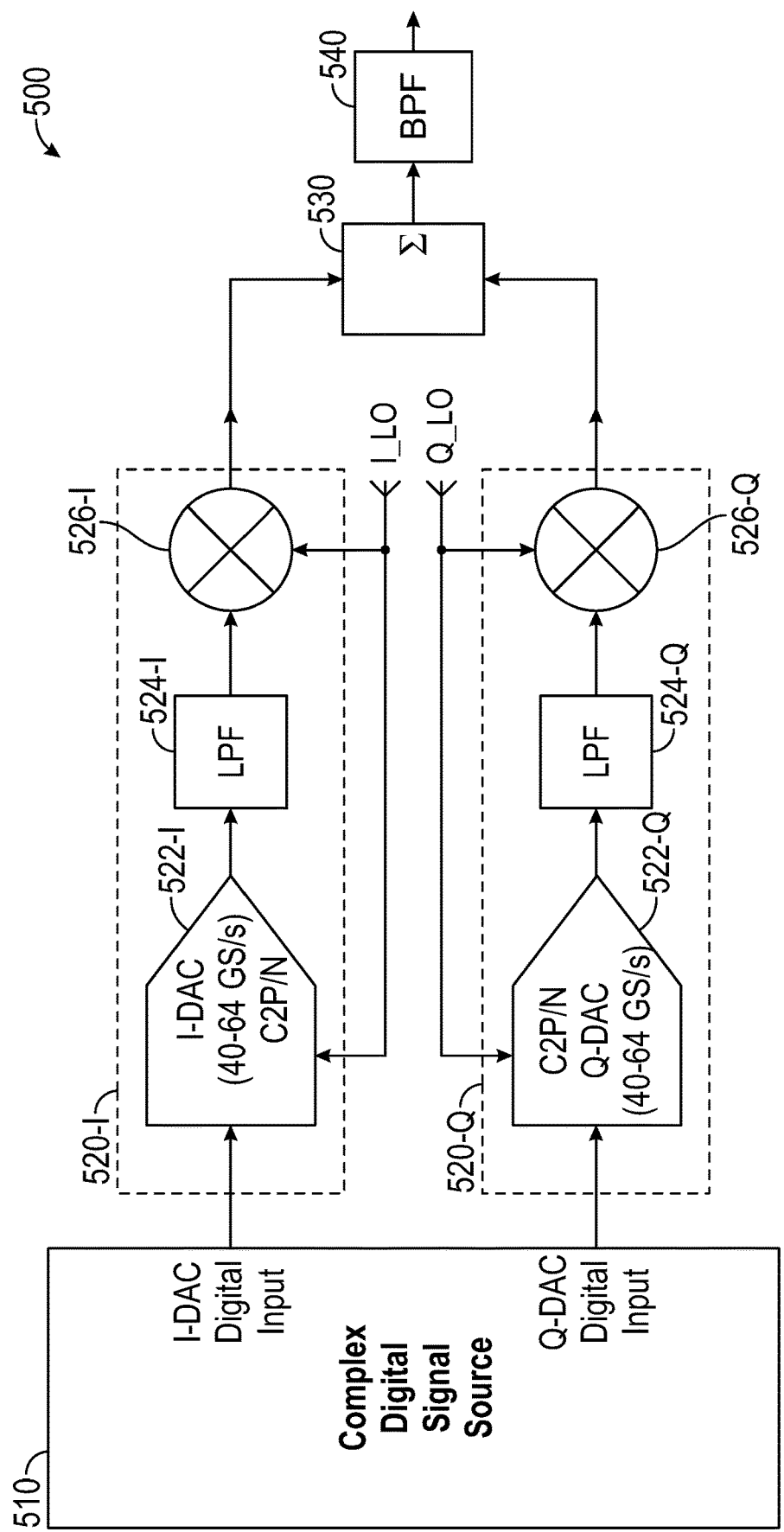
FIG. 5 is a block diagram illustrating an example implementation of a quadrature RF mixing DAC configuration.

FIG. 5 is a block diagram illustrating an example implementation of a quadrature RF mixing DAC configuration 500. The configuration shown in FIG. 5 is an RF mixing DAC implementation of the quadrature mixer of FIG. 3, which uses both an I-phase and a Q-phase for image rejection and cancellation, as discussed above with respect to FIGS. 4A-through 4C. The quadrature RF mixing DAC configuration 500 includes I- and Q-sections 520-I and 520-Q, a summation circuit 530 and a bandpass filter (BPF) 540. The I-section 520-I includes an I-DAC 522-I, a low-pass filter (LPF) 524-I and a I-mixer 526-I. The Q-section 520-Q includes a Q-DAC 522-Q, a low-pass filter (LPF) 524-Q and a Q-mixer 526-Q. The I- and Q-sections 520-I and 520-Q receive digital input I and Q signals (e.g., IF signals) from a complex digital signal source 510 such as a baseband processor. The I-mixer 526-I and the Q-mixer 526-Q can up-convert the IF signals using LO signals (e.g., I_LO and Q_LO). The output signals of the I- and Q-mixers 526-I and 526-Q are summed by the summation circuit 530 and filtered via the BPF 540 to generate a composite RF-DAC output signal with a frequency within a range of about 80-128 GHz.

Figure 6:
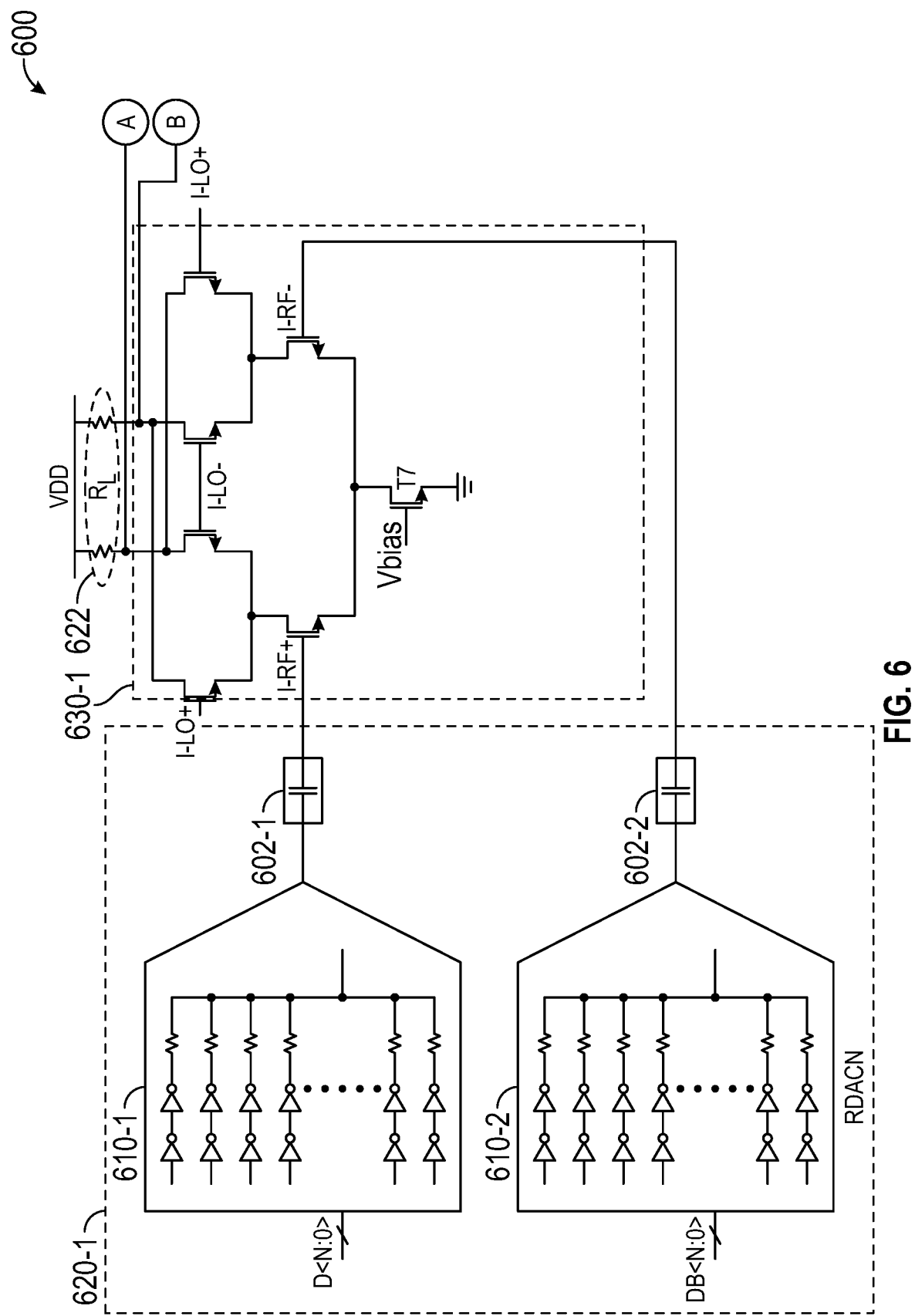
FIG. 6 is a schematic diagram illustrating an example of a quadrature RF mixing DAC circuit.
Figure 6:
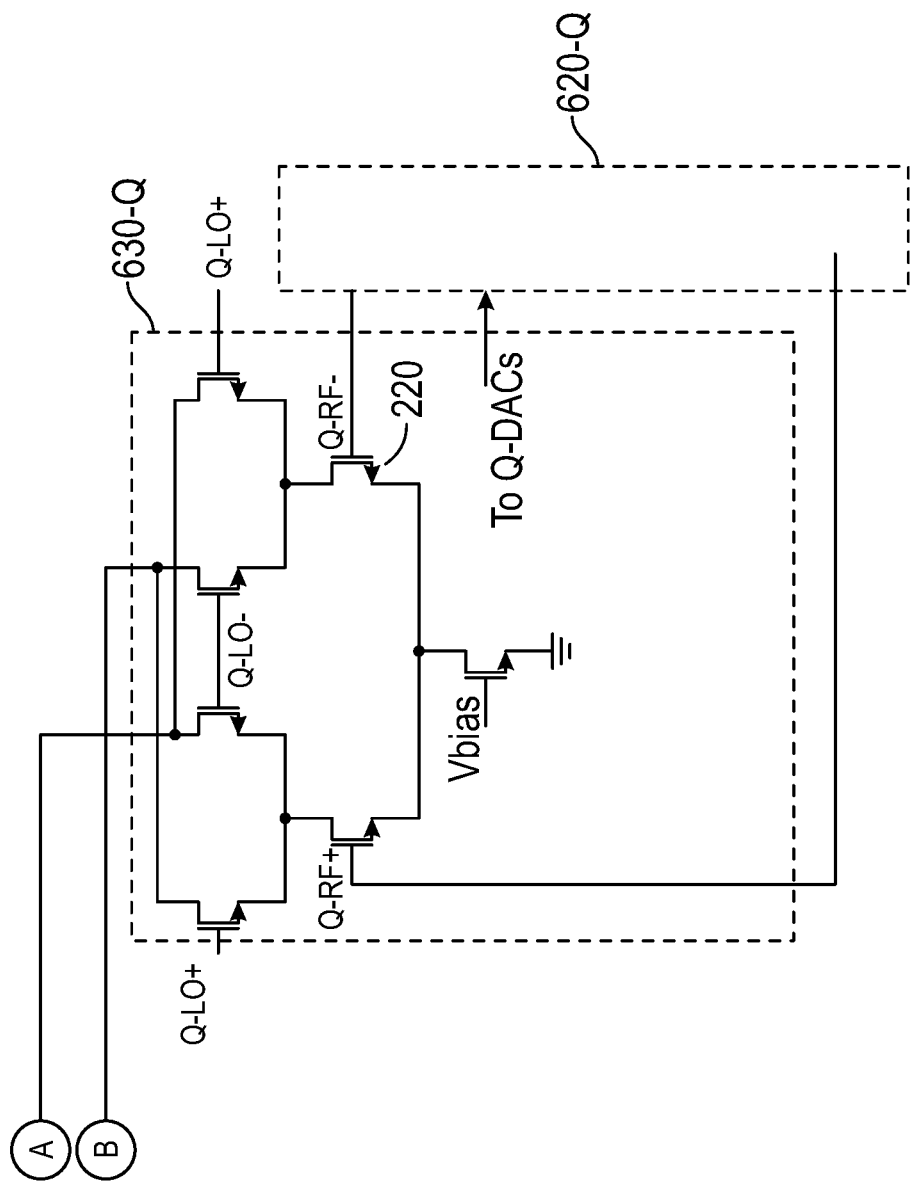

FIG. 6 is a schematic diagram illustrating an example of a quadrature RF mixing DAC circuit 600. The quadrature RF mixing DAC circuit 600 (hereinafter "mixing DAC circuit 600") is formed by combining two double-balanced mixer circuits 630-I and 630-Q, which are similar to the double-balanced mixer circuit 200B of FIG. 2B, described above. The double-balanced mixer circuit 630-I is used as an I-mixer, and the double-balanced mixer circuit 630-Q is employed as a Q-mixer. The I-mixer 630-I receives I-RF signal from I-DAC 620-I and the Q-mixer 630-Q receives Q-RF signal from Q-DAC 620-Q. The I-DAC 620-I includes RDACs 610-1 and RDAC 610-2 and DC-blocking circuits 602-1 and 602-2, which are similar to the RDAC 201-1 and 201-2 and the DC-blocking circuits 202-1 and 202-2 of FIG. 2A. The Q-DAC 620-Q is similar to the I-DAC 620-I and its circuit details are not shown for simplicity. The output signals of the I-mixer 630-I and the and the Q-mixer 630-Q are coupled together to a load network 622 formed of the load resistors $R_L$, which also performs the role of the summation circuit 530 of FIG. 5.

Figure 7:
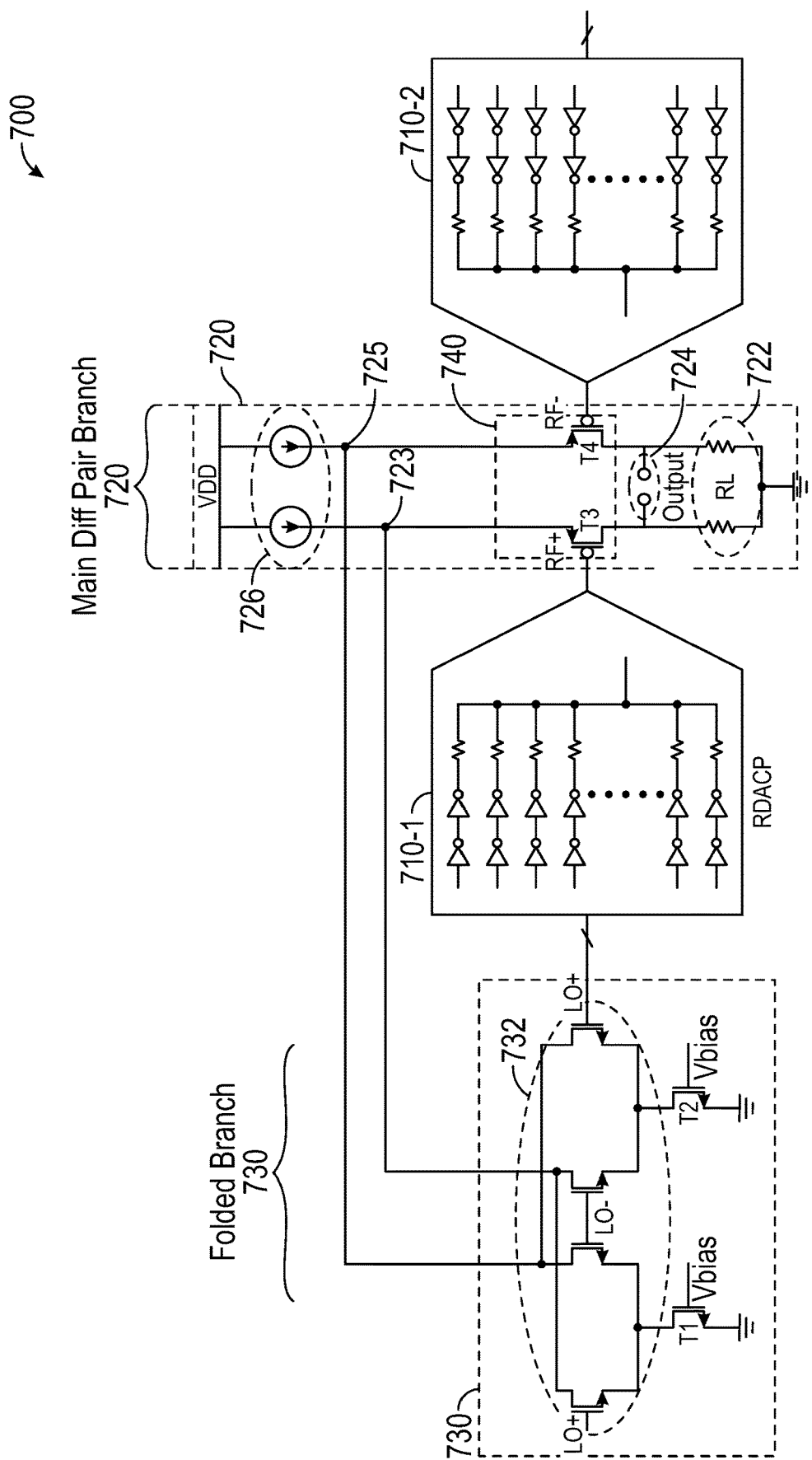
FIG. 7 is a schematic diagram illustrating an example of a folded RF mixing double-balanced DAC circuit.

FIG. 7 is a schematic diagram illustrating an example of a folded RF mixing double-balanced DAC circuit 700. The folded RF mixing double-balanced DAC circuit 700 includes a main differential pair branch 720 and a folded LO branch 730 coupled in parallel. The RF differential signals (RF+ and RF−) are provided at the output nodes of the resistive DACs 710-1 and 710-2 of the main differential pair branch 720, and the differential LO signals (LO+ and LO−) are applied to gates of two cross-coupled differential pairs 732 of the folded LO branch 730. The folded LO branch 730 is the switching branch that includes cross-coupled differential pairs 732, which are coupled via the tail transistors T1 and T2 to the ground potential. The gate nodes of the tail transistors T1 and T2 are coupled to a suitable bias point. It is understood that the folded RF mixing double-balanced DAC circuit 700 is not a quadrature implementation. The resistive DACs 710-1 and 710-2 are similar to resistive DACs 210-1 and 210-2 of FIG. 2-A discussed above. The output nodes of the folded LO branch 730 are connected, at nodes 723 and 725 to source nodes of PMOS transistors T3 and T4 of a differential pair 740. The nodes 723 and 725 are coupled via a pair of bias current sources 726 to a supply voltage VDD. The load network 722 is formed of two load resistors RL and the output signal can be derived from the output nodes 724, which are the connection points of the load network 722 and drain nodes of the transistors T3 and T4 of the differential pair 740.

Figure 8:
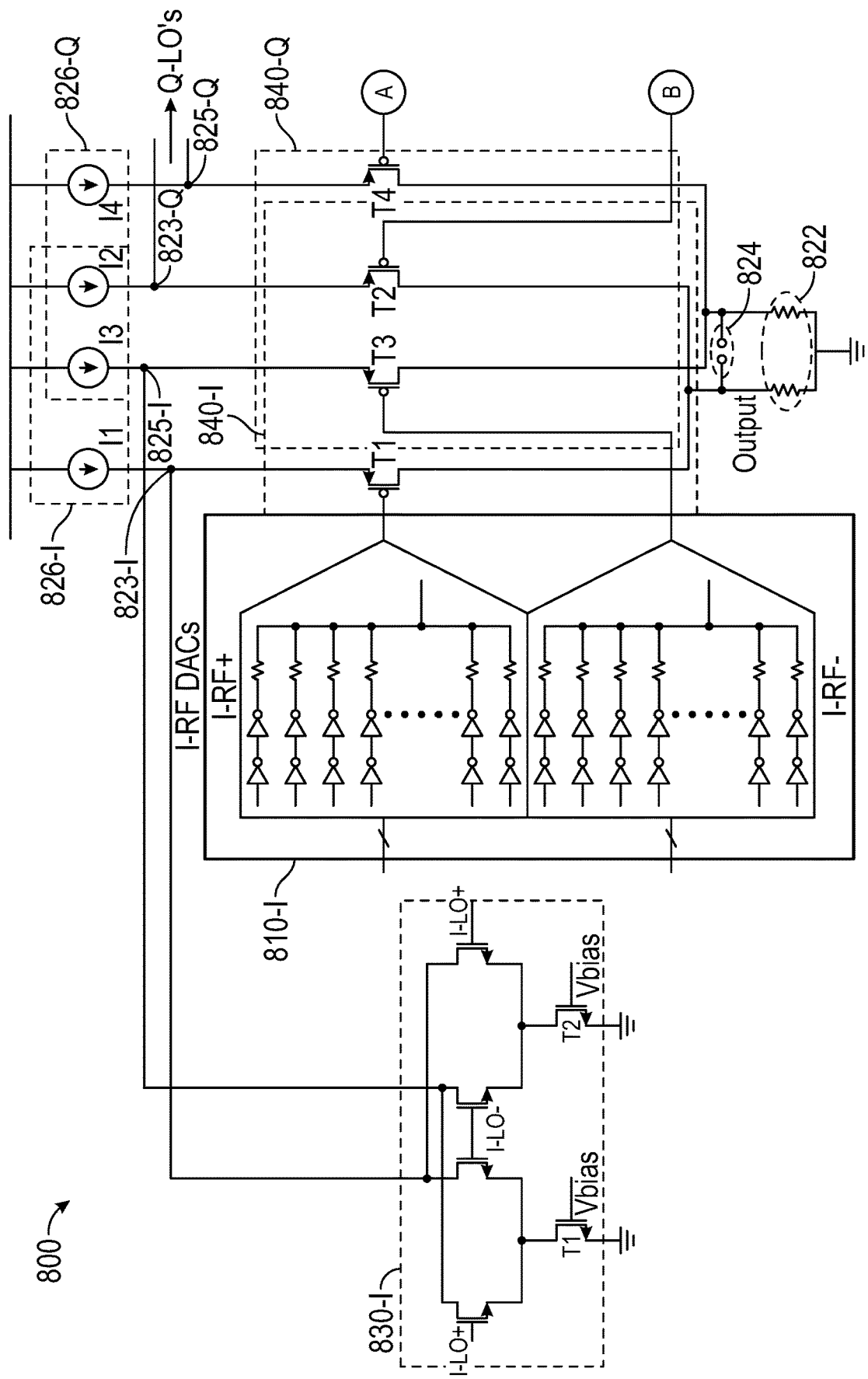
FIG. 8 is a schematic diagram illustrating an example of a folded quadrature RF mixing DAC circuit.
Figure 8:
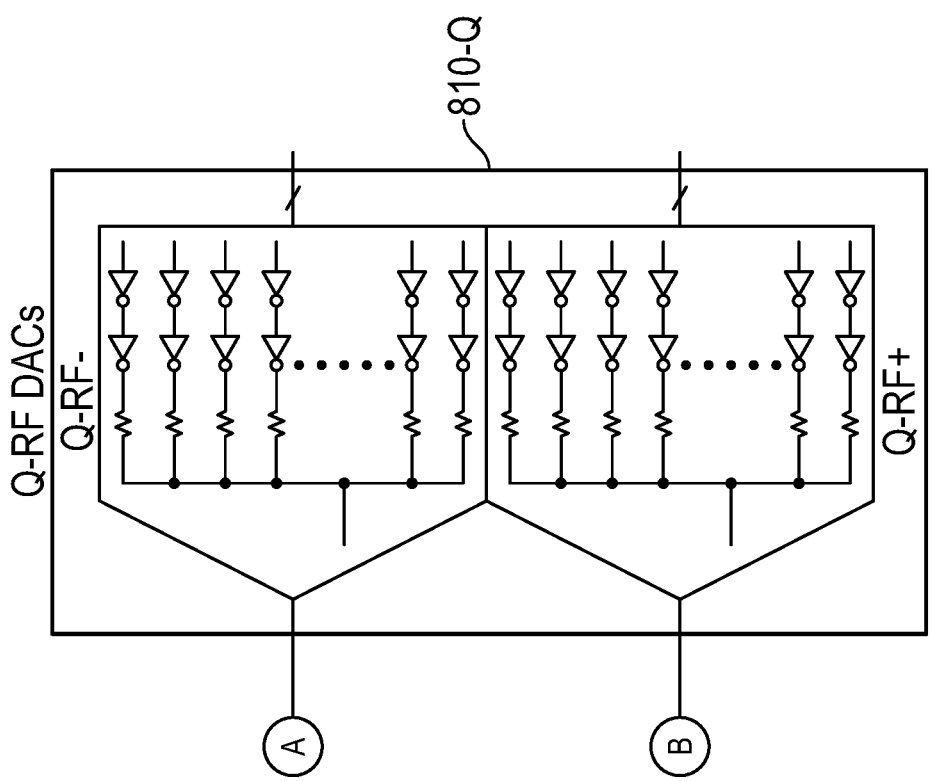

FIG. 8 is a schematic diagram illustrating an example of a folded quadrature RF mixing DAC circuit 800. The folded quadrature RF mixing DAC circuit 800 includes two quadrature RF mixer branches including differential pairs 840-I and 840-Q and bias current sources 826-I and 826-Q and two folded quadrature LO branches 830-I and 830-Q coupled in parallel. For simplicity, only one of the two folded quadrature LO branches (830-I) coupled to nodes 823-I and 825-I is shown and the 830-Q branch coupled to nodes 823-Q and 825-Q is shown. The differential pairs 840-I and 840-Q of the quadrature RF mixer branches are similar to the differential pair 740 of the main differential pair branch 720 of FIG. 7 coupled in parallel. The two differential pairs 840-I and 840-Q share a load network 822 that is formed of a pair of load resistors coupled to the ground potential. The I and Q RF DACs 810-I and 810-Q provide I-RF+ and I-RF+ and Q-RF− and Q-RF+ signals. The I-RF+ and Q-RF+ signals are provided to the gate nodes of the transistors T1 and T2 of the differential pair 840-I, and the I-RF− and Q-RF− signals are provided to the gate nodes of the transistors T3 and T4 of the differential pair 840-Q. The folded quadrature LO branches 830-I and 830-Q (not shown for simplicity) are similar to the folded LO branch 730 of FIG. 7. One of the folded quadrature LO branches (e.g., 830-I) is used as the I-mixer for the LO signals and the other one (e.g., 830-Q, not shown) is used as the Q-mixer for the LO signals.

Figure 9:
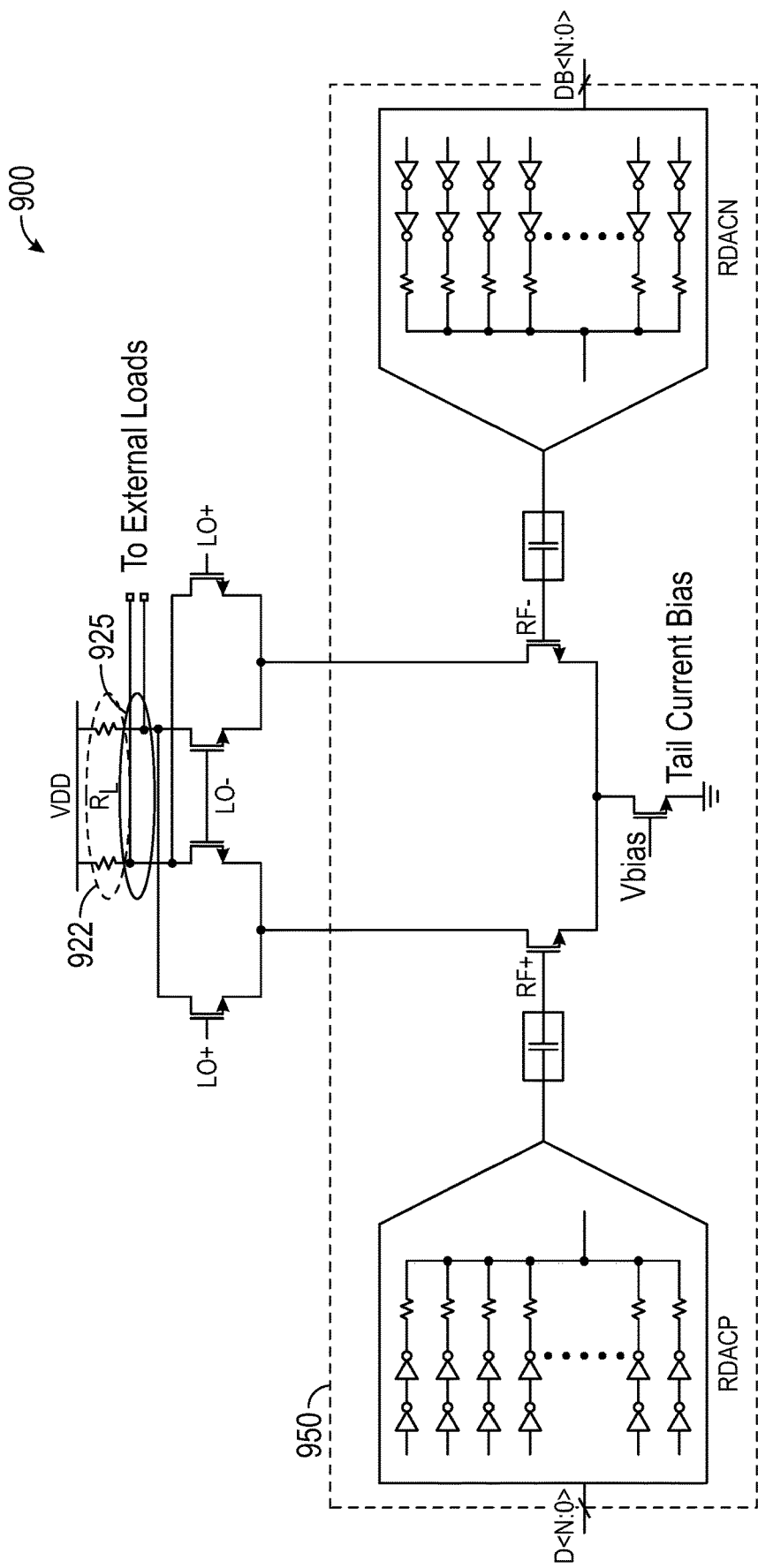
FIG. 9 is a schematic diagram illustrating an example of a double-balanced RF mixing DAC circuit.
Figure 10:
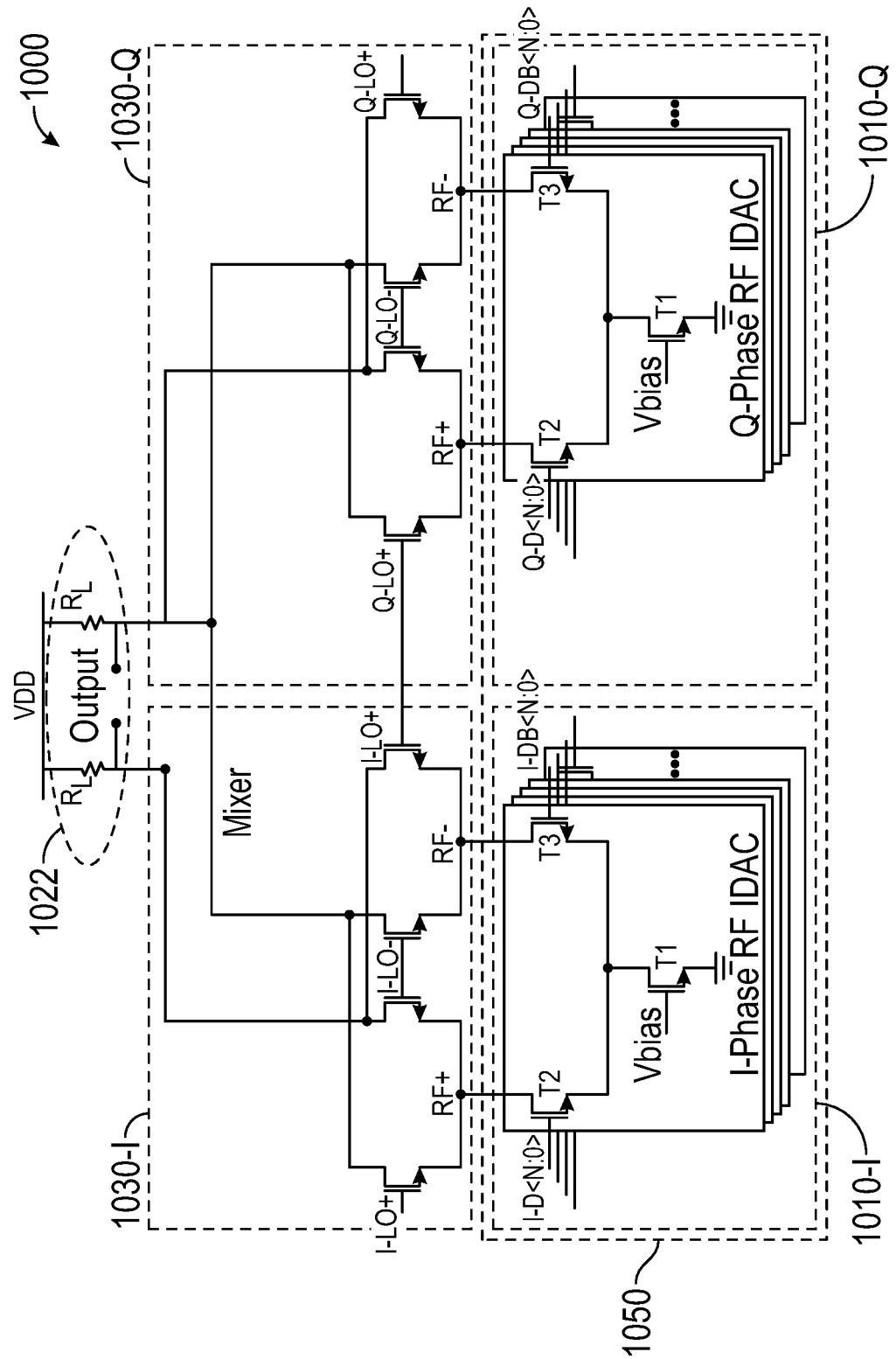
FIG. 10 is a schematic diagram illustrating an example implementation of the quadrature RF mixing DAC circuit.

FIG. 9 is a schematic diagram illustrating an example of a double-balanced RF mixing DAC circuit 900. The double-balanced RF mixing DAC of 900 is similar to the double-balanced RF mixing DAC of FIG. 2B and is shown in FIG. 9 to indicate that the entire portion of the circuit 950 enclosed in the broken line box can be replaced with a current steering DAC. In other RF mixing DACs discussed above, the resistive DACs can be similarly replaced with current steering DACs, as will be described herein FIG. 10 is a schematic diagram illustrating an example of a quadrature RF mixing current steering DAC circuit 1000. The quadrature RF mixing current steering DAC circuit 1000 is a Current steering DAC implementation of the quadrature RF mixing DAC circuit 600 of FIG. 6, which was implemented using resistive DAC circuits 620-I and 620-Q. In the current steering DAC circuit 1000, current steering DACs 1010-I and 1010-Q replace the resistive DAC circuits 620-I and 620-Q of FIG. 6. The current steering DACs 1010-I and 1010-Q are similar in structure and functionalities. For example, the current steering DACs 1010-I includes N differential pairs (e.g., formed of transistors T2 and T3) coupled via a tail transistor T1 to the ground potential. The number N represents the number of bits of the digital input signal. The differential pair of the current steering DACs 1010-I are coupled to RF inputs (e.g., RF+ and RF−) of the LO switches of a mixer core 1030-I. Similarly, the differential pair of the current steering DACs 1010-Q are coupled to RF inputs of the LO switches of a mixer core 1030-Q. The mixer cores 1030-I and 1030-Q are cross-coupled differential pairs discussed above. The output of the mixers cores 1010-I and 1010-Q are coupled to the load network 1022, which is similar to the load network 622 of FIG. 6.

Figure 11:
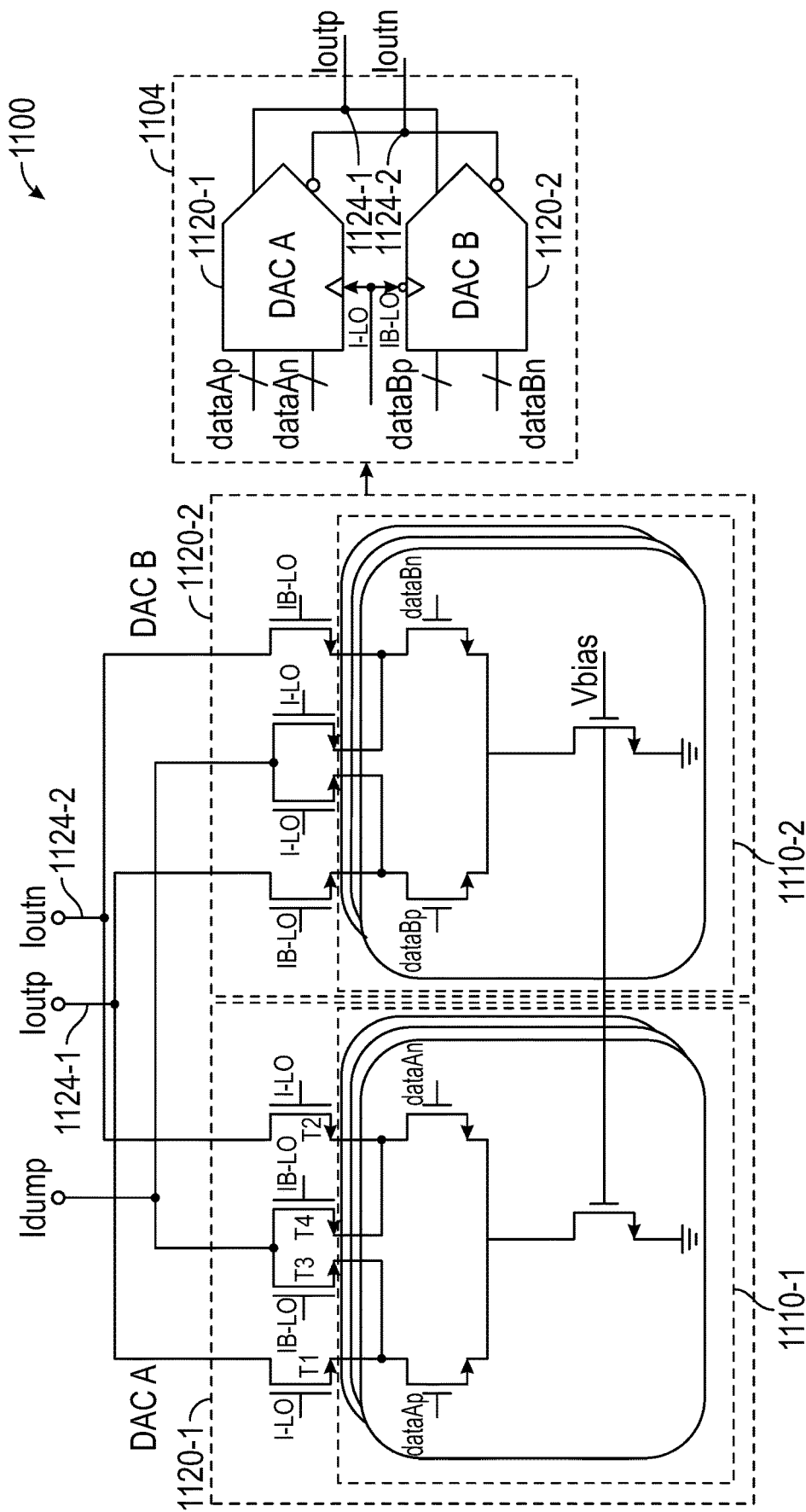
FIG. 11 is a schematic diagram illustrating an example of a basis interleaved RF mixing current steering DAC driver circuit.

FIG. 11 is a schematic diagram illustrating an example of a basis interleaved RF mixing current steering DAC driver circuit 1100. The basis interleaved RF mixing current steering DAC driver circuit 1100 includes two similar RF mixing current steering DAC driver circuits 1120-1 and 1120-2, which are interleaved at their output nodes 1124-1 and 1124-2. The RF mixing current steering DAC driver circuit 1120-1 includes a current steering DAC 1110-1 and the RF mixing current steering DAC driver circuit 1120-2 includes a current steering DAC 1110-2. The current steering DAC 1110-1 is similar in structure and functionalities to current steering DAC 1110-2 and to the current steering DAC driver circuit 1020-1 of FIG. 10 described above. The mixing cores of the two RF mixing current steering DAC driver circuits 1120-1 and 1120-2 are similar and each is formed of first differential pair (e.g., T1 and T2) coupled in parallel with a second differential pair (e.g., T3 and T4). For example, the first differential pair receives positives LO signals (I-LO) and provides first output current (e.g., Ioutp). The second differential pair receives negative LO signals (IB-LO) and provides dump currents (e.g., Idump) for the first set of current-steering DAC driver circuits when transistors of the first differential pair are off. The two RF mixing current steering DAC driver circuits 1120-1 and 1120-2 and their interleaved connections are represented symbolically with an equivalent circuit block 1104 shown on the right-hand side of the FIG. 11. The equivalent circuit block 1104 is used in the following figure to represent the two RF mixing current steering DAC driver circuits 1120-1 (e.g., DACA) and 1120-2 (e.g., DACB) with their associated clocks (e.g., I-LO and IB-LO). Each of the DACs receive two complementary sets of N bit digital signals. For example, the DACA receives N-bit dataAp and N-bit dataAn, and the DACB receives N-bit dataBp and N-bit dataBn. It is noted that dataBp and dataBn are complements of the dataAp and dataAn.

Figure 12:
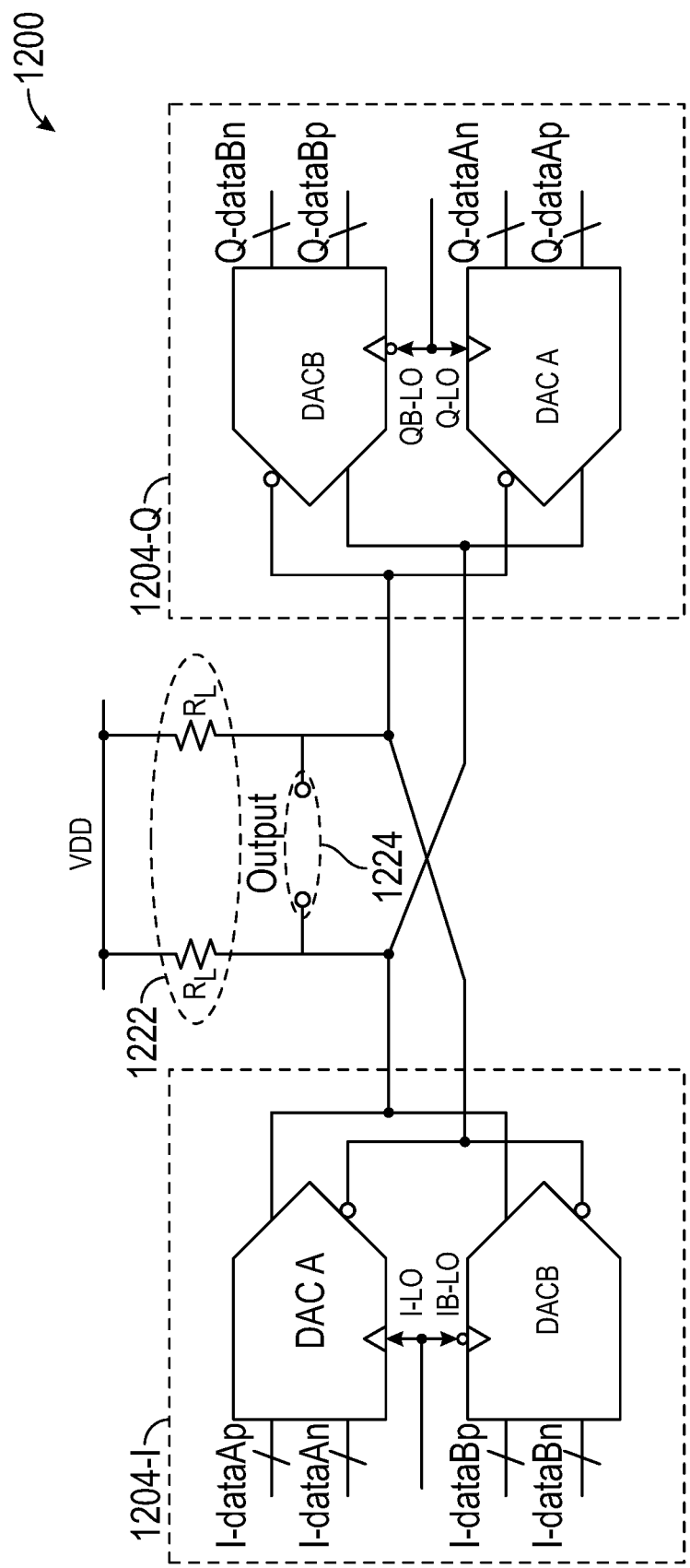
FIG. 12 is a schematic diagram illustrating an example of an RF quadrature RF mixing interleaved current steering DAC circuit.

FIG. 12 is a schematic diagram illustrating an example of an RF quadrature mixing interleaved current steering DAC circuit 1200. The RF quadrature mixing interleaved current steering DAC circuit 1200 includes RF mixing current steering DAC driver circuits 1204-I and 1204-Q, which are interleaved and are similar to the equivalent circuit block 1104 of FIG. 11 described above. The corresponding DACA and DACB of the RF mixing current steering DAC driver circuits 1204-I and 1204-Q are similarly interleaved at their connections to the load circuit 1222 that includes resistive loads RL that are coupled to VDD, and provide an output signal at output nodes 1224. The corresponding DACA and DACB of the RF mixing current steering DAC driver circuits 1204-I and 1204-Q are clocked by their respective I-clk (e.g., I-LO and IB-LO) and Q-clk (e.g., Q-LO and QB-LO).

Figure 13:
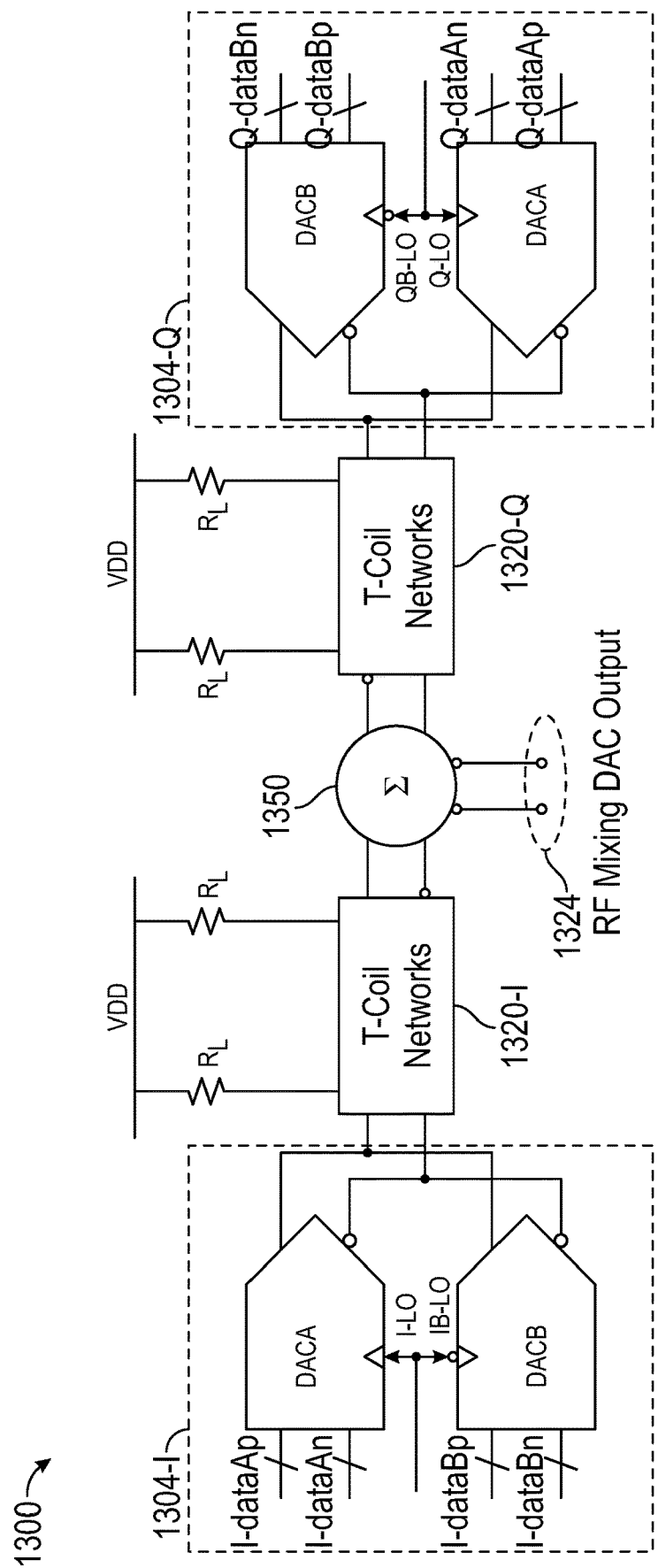
FIG. 13 is a schematic diagram illustrating an example of a modified RF quadrature mixing interleaved current steering DAC circuit.

FIG. 13 is a schematic diagram illustrating an example of a modified RF quadrature mixing interleaved current steering DAC circuit 1300. The modified RF quadrature mixing interleaved current steering DAC circuit 1300 is a modified version of the RF quadrature mixing interleaved current steering DAC circuit 1200 of FIG. 12 with addition of T-coil networks 1320-I and 1320-Q and a power combiner circuit 1350. The T-coil networks 1320-I and 1320-Q couple output nodes of the respective I and Q equivalent circuit blocks 13044 and 1304-B to the power combiner circuit 1350, which provides an output signal at the output nodes 1324. Each of the I and Q equivalent circuit blocks 1304-I and 1304-B are similar to the equivalent circuit block 1104 of FIG. 11 described above. Each of the T-coil networks 1320-I and 1320-Q include a T-coil formed of an inductive circuit and are coupled through respective load networks formed of load resistors (RL) to VDD. In one or more implementations, the power combiner circuit 1350 can be implemented with passive elements such as resistors, inductor, or transmission lines.

Figure 14:
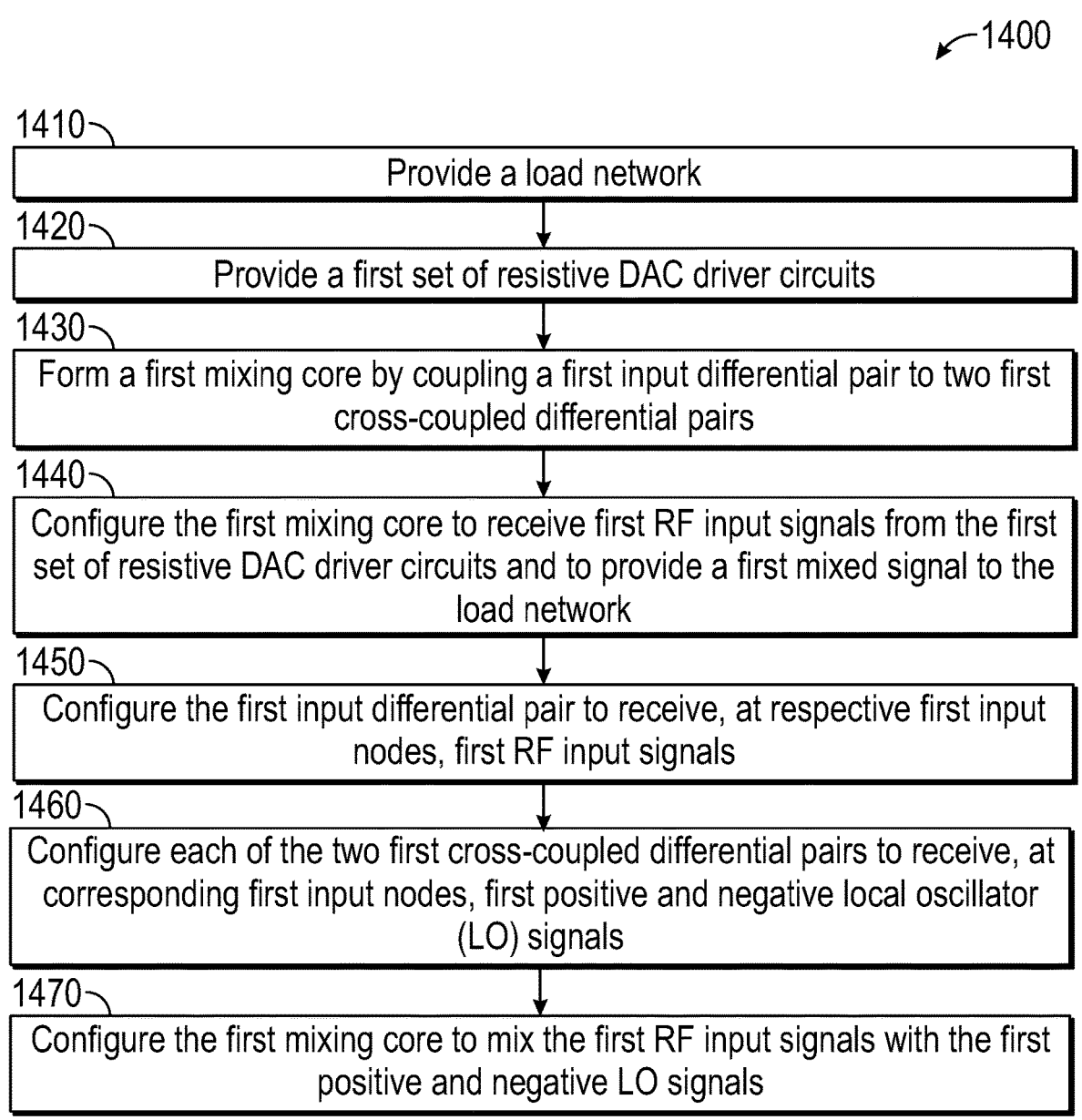
FIG. 14 is a flow diagram illustrating an example method of providing a single-balanced RF mixing DAC circuit.

FIG. 14 is a flow diagram illustrating an example method 1400 of providing a single-balanced RF mixing DAC circuit. The method 1400 begins with providing a load network (e.g., 222 of FIG. 2A) (1410). The method further includes providing first set of resistive DAC driver circuits (e.g., 210 of FIG. 2A) (1420). A first mixing core may be formed by coupling a first input differential pair (e.g., 220 of FIG. 2A) to two first cross-coupled differential pairs (e.g., 230 of FIG. 2A) (1430). The first mixing core can receive first RF input signals (e.g., RF+ and RF− of FIG. 2A) from the first set of resistive DAC driver circuits, and to provide a first mixed signal to the load network (1440). The first input differential pair can receive, at respective first input nodes (e.g., gate node of T1 and T2 of FIG. 2A), first RF input signals (1450). Each of the two first cross-coupled differential pairs can receive, at corresponding first input nodes (e.g., gate nodes of T3 and T6 of FIG. 2A), first positive and negative local oscillator (LO) signals (e.g., LO+ and LO− of FIG. 2A) (1460). The first mixing core can mix the first RF input signals with the first positive and negative LO signals (1470).

Various examples of aspects of the disclosure are described below as clauses for convenience. These are provided as examples, and do not limit the subject technology.

Clause A: A double-balanced radio-frequency (RF) mixing digital-to-analog converter (DAC) apparatus includes a load network, a first set of resistive DAC driver circuits and a first mixing core. The first mixing core can receive first RF input signals from the first set of resistive DAC driver circuits and can provide a first mixed signal to the load network. The first mixing core includes a first input differential pair coupled to two first cross-coupled differential pairs. The first input differential pair can receive first RF input signals at respective first input nodes. Each of the two first cross-coupled differential pairs can receive first positive and negative local oscillator (LO) signals at corresponding first input nodes. The first mixing core can mix the first RF input signals with the first positive and negative LO signals.

Clause B: A method of providing a double-balanced RF mixing DAC includes providing a load network and a first set of resistive DAC driver circuits. The method further includes forming a first mixing core by coupling a first input differential pair to two first cross-coupled differential pairs. The first mixing core can receive first RF input signals from the first set of resistive DAC driver circuits and to provide a first mixed signal to the load network. The first input differential pair can receive, at respective first input nodes, first RF input signals. Each of the two first cross-coupled differential pairs can receive, at corresponding first input nodes, first positive and negative local oscillator (LO) signals. The first mixing core can mix the first RF input signals with the first positive and negative LO signals.

Clause C: A current-steering RF mixing DAC apparatus includes a load network, a first set of current-steering DAC driver circuits and a second set of current-steering DAC driver circuits. The apparatus further includes a first mixing core that can receive first RF input signals from the first set of current-steering DAC driver circuits and can provide a first mixed signal to the load network. A second mixing core can receive second RF input signals from the second set of current-steering DAC driver circuits and can provide a second mixed signal to the load network. Each of the first set of current-steering DAC driver circuits and the second set of current-steering DAC driver circuits has N input differential pairs. Each input differential pair of the N input differential pairs is coupled to a tail transistor. The input differential pair is configured to receive, at two corresponding input nodes, a bit and a respective compliment bit of a first or a second digital signal. The first set of current-steering DAC driver circuits can convert the first digital signal to the first RF signal. The second set of current-steering DAC driver circuits can convert the second digital signal to the second RF signal. A method comprising one or more methods, operations or portions thereof described herein.

An apparatus comprising means adapted for performing one or more methods, operations or portions thereof described herein.

A hardware apparatus comprising circuits configured to perform one or more methods, operations or portions thereof described herein.

An apparatus comprising means adapted for performing one or more methods, operations or portions thereof described herein.

An apparatus comprising components operable to carry out one or more methods, operations or portions thereof described herein.

In one aspect, a method may be an operation, an instruction, or a function and vice versa. In one aspect, a clause may be amended to include some or all of the words (e.g., instructions, operations, functions, or components) recited in other one or more clauses, one or more words, one or more sentences, one or more phrases, one or more paragraphs, and/or one or more claims. During prosecution, one or more claims may be amended to depend on one or more other claims, and one or more claims may be amended to delete one or more limitations.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

In one aspect, a transistor may be a bipolar junction transistor (BJT), and it may refer to any of a variety of multi-terminal transistors generally operating on the principal of carrying current using both electrons and holes, including but not limited to an n-p-n BJT and a p-n-p BJT.

In one aspect, a transistor may be a field effect transistor (FET), and it may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A double-balanced radio frequency (RF) mixing digital-to-analog converter (DAC) apparatus, the apparatus comprising:
   a load network;
   a first set of resistive DAC driver circuits; and
   a first mixing core configured to receive first RF input signals from the first set of resistive DAC driver circuits and to provide a first mixed signal to the load network,
   wherein:
      the first mixing core comprises a first input differential pair coupled to two first cross-coupled differential pairs,
      the first input differential pair is configured to receive the first RF input signals at respective first input nodes,
      each of the two first cross-coupled differential pairs is configured to receive first positive and negative local oscillator (LO) signals at corresponding first input nodes,
      the first mixing core is configured to mix the first RF input signals with the first positive and negative LO signals, and
      the apparatus comprises a tail current source coupled to a common node of the first input differential pair.

2. The apparatus of claim 1, wherein the first input differential pair and the two first cross-coupled differential pairs comprise metal-oxide semiconductor (MOS) transistors, and wherein MOS transistors comprise NMOS transistors.

3. The apparatus of claim 2, wherein the load network comprises two resistors coupled to a voltage bias source at a common first node of the two resistors, and wherein second nodes of the two resistors are coupled to first output nodes of the two first cross-coupled differential pairs.

4. The apparatus of any of claim 3, further comprising:
   a second set of resistive DAC driver circuits; and
   a second mixing core configured to receive second RF input signals from the second set of resistive DAC driver circuits and to provide a second mixed signal to the load network,
   wherein:
      the second mixing core comprises a second input differential pair coupled to two second cross-coupled differential pairs,
      the second input differential pair is configured to receive the second RF input signals at respective second input nodes,
      each of the two second cross-coupled differential pairs is configured to receive second positive and negative local oscillator (LO) signals at corresponding second input nodes, and
      the second mixing core is configured to mix the second RF input signals with the second positive and negative LO signals.

5. The apparatus of claim 1, wherein the apparatus is configured as a fold-back circuit, and wherein in the fold-back circuit the first input differential pair comprises:
   a first set of PMOS transistors;
   gate nodes of the first set of PMOS transistors are coupled to the first set of resistive DAC driver circuits;
   drain nodes of the first set of PMOS transistors are coupled the load network; and
   source nodes of the first set of PMOS transistors are coupled to a first set of bias current sources.

6. The apparatus of claim 5, wherein:
   transistors of the first mixing core comprise NMOS transistors,
   common source nodes of the two first cross-coupled differential pairs are coupled via a first pair of tail transistors to a ground potential; and
   common drain nodes of the two first cross-coupled differential pairs are coupled to the source nodes of the first set of PMOS transistors.

7. The apparatus of claim 5, wherein in the fold-back circuit, the first input differential pair comprises:
   a second set of PMOS transistors;
   gate nodes of the second set of PMOS transistors are coupled to a second set of resistive DAC driver circuits;
   drain nodes of the second set of PMOS transistors are coupled the load network; and
   source nodes of the second set of PMOS transistors are coupled to a second set of bias current sources.

8. The apparatus of claim 7, further comprising a second mixing core comprising two second cross-coupled differential pairs formed of NMOS transistors,
   wherein:
   common source nodes of the two second cross-coupled differential pairs are coupled via a second pair of tail transistors to a ground potential, and
   common drain nodes of the two second cross-coupled differential pairs are coupled to the source nodes of the second set of PMOS transistors.

9. A current-steering radio-frequency (RF) mixing digital-to-analog converter (DAC) apparatus, the apparatus comprising:

a load network;
a first set of current-steering DAC driver circuits;
a second set of current-steering DAC driver circuits;
a first mixing core configured to receive first RF input signals from the first set of current-steering DAC driver circuits and to provide a first mixed signal to the load network; and
a second mixing core configured to receive second RF input signals from the second set of current-steering DAC driver circuits and to provide a second mixed signal to the load network,
wherein:
  each of the first set of current-steering DAC driver circuits and the second set of current-steering DAC driver circuits comprises N input differential pairs,
  each input differential pair of the N input differential pairs is coupled to a tail transistor,
  the input differential pair is configured to receive, at two corresponding input nodes, a bit and a respective compliment bit of a first or a second digital signal,
  the first set of current-steering DAC driver circuits are configured to convert the first digital signal to the first RF signal, and
  the second set of current-steering DAC driver circuits are configured to convert the second digital signal to the second RF signal.

10. The apparatus of claim 9, wherein:
the first mixing core comprises first cross-coupled differential pairs configured to receive in-phase (I) positive and negative LO signals at corresponding first input nodes, and
the second mixing core comprises second cross-coupled differential pairs configured to receive quadrature positive and negative local oscillator (LO) signals at corresponding first input nodes.

11. The apparatus of claim 9, wherein:
each of the first mixing core and the second mixing core comprises a first differential pair coupled in parallel with a second differential pair,
the first differential pair is configured to receive positive LO signals and to provide first output currents, and
the second differential pair is configured to receive negative LO signals and to provide dump currents for the first set of current-steering DAC driver circuits when transistors of the first differential pair are off.

12. The apparatus of claim 11, wherein:
the first differential pair is coupled to the load network and is configured to provide output currents to the load network, and
the second differential pair is coupled to a dump current source configured to provide the dump currents.

13. The apparatus of claim 11, further comprising a T-coil network, and wherein the first differential pair is coupled to the T-coil network, and wherein the T-coil network is coupled to the load network.

14. The apparatus of claim 13, further comprising a power combiner configured to couple the T-coil network to an output circuit.

15. A method of providing a double-balanced radio-frequency (RF) mixing digital-to-analog converter (DAC), the method comprising:
providing a load network;
providing a first set of resistive DAC driver circuits;
forming a first mixing core by coupling a first input differential pair to two first cross-coupled differential pairs;
configuring the first mixing core to receive first RF input signals from the first set of resistive DAC driver circuits and to provide a first mixed signal to the load network;
configuring the first input differential pair to receive, at respective first input nodes, the first RF input signals;
configuring each of the two first cross-coupled differential pairs to receive, at corresponding first input nodes, first positive and negative local oscillator (LO) signals;
configuring the first mixing core to mix the first RF input signals with the first positive and negative LO signals; and
coupling a tail current source to a common node of the first input differential pair.

16. The method of claim 15, further comprising:
providing a second set of resistive DAC driver circuits;
forming a second mixing core by coupling a second input differential pair to two second cross-coupled differential pairs;
configuring the second mixing core to receive second RF input signals from the second set of resistive DAC driver circuits and to provide a second mixed signal to the load network;
configuring the second input differential pair to receive, at respective second input nodes, the second RF input signals;
configuring each of the two second cross-coupled differential pairs to receive, at corresponding second input nodes, second positive and negative local oscillator (LO) signals; and
configuring the second mixing core to mix the second RF input signals with the second positive and negative LO signals.

17. The method of claim 15, further comprising configuring a fold-back circuit and in the fold-back circuit forming the first input differential pair by:
providing a first set of PMOS transistors;
coupling gate nodes of the first set of PMOS transistors to the first set of resistive DAC driver circuits;
coupling drain nodes of the first set of PMOS transistors to the load network; and
coupling source nodes of the first set of PMOS transistors to a first set of bias current sources.

18. The method of claim 17, further comprising forming, using NMOS transistors, a second mixing core using two second cross-coupled differential pairs.

19. The method of claim 18, wherein forming the second mixing core comprises:
coupling common source nodes of the two second cross-coupled differential pairs via a second pair of tail transistors to a ground potential; and
coupling common drain nodes of the two second cross-coupled differential pairs to the source nodes of a second set of PMOS transistors.

* * * * *

UNITED STATES PATENT AND TRADEMARK OFFICE
CERTIFICATE OF CORRECTION

PATENT NO. : 10,897,266 B2
APPLICATION NO. : 16/609630
DATED : January 19, 2021
INVENTOR(S) : Ark-Chew Wong et al.

It is certified that error appears in the above-identified patent and that said Letters Patent is hereby corrected as shown below:

In the Claims

Column 12, Line 6 (Claim 4), Replace "any of claim 3" with --claim 3--;

Column 12, Line 34 (Claim 5), Replace "coupled the load network" with --coupled to the load network--;

Column 12, Line 52 (Claim 7), Replace "coupled the load network" with --coupled to the load network--.

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*